US012803572B2

(12) United States Patent
Fahmy

(10) Patent No.: US 12,803,572 B2
(45) Date of Patent: Nov. 17, 2026

(54) LOW POWER SENSOR HAVING ADAPTIVE ADC RESOLUTION

(71) Applicant: Allegro MicroSystems, LLC, Manchester, NH (US)

(72) Inventor: Ahmed Hassan Fahmy, Andover, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 208 days.

(21) Appl. No.: 18/891,237

(22) Filed: Sep. 20, 2024

(65) Prior Publication Data

US 2026/0088825 A1 Mar. 26, 2026

(51) Int. Cl.
*H03M 1/20* (2006.01)
*G01D 5/14* (2006.01)

(52) U.S. Cl.
CPC ................ *H03M 1/20* (2013.01); *G01D 5/14* (2013.01); *G01D 2205/18* (2021.05)

(58) Field of Classification Search
CPC ........... H03M 1/20; G01D 5/14; G01D 5/145; G01D 2205/18
See application file for complete search history.

(56) References Cited

U.S. PATENT DOCUMENTS

| | | | | |
|---|---|---|---|---|
| 8,222,888 | B2 | 7/2012 | David et al. | |
| 9,774,343 | B1 * | 9/2017 | Liaghati | H03M 1/186 |
| 10,635,539 | B2 | 4/2020 | Cook et al. | |
| 11,624,799 | B2 | 4/2023 | Cesaretti et al. | |
| 2008/0144162 | A1 * | 6/2008 | Duroux | C03C 17/3411 204/192.15 |
| 2013/0076465 | A1 * | 3/2013 | Hernandez-Oliver | B60Q 1/441 335/205 |
| 2013/0119941 | A1 * | 5/2013 | Moorhead | B60L 58/21 320/136 |
| 2020/0225020 | A1 * | 7/2020 | Lassalle-Balier | G01B 7/14 |
| 2021/0262831 | A1 * | 8/2021 | Foletto | G01D 5/147 |
| 2022/0291304 | A1 * | 9/2022 | Richards | G01P 13/045 |
| 2023/0020628 | A1 * | 1/2023 | Krauska | G01R 13/0218 |
| 2023/0152393 | A1 * | 5/2023 | Haas | G01R 33/091 702/57 |

* cited by examiner

*Primary Examiner* — Dominic E Hawkins
(74) *Attorney, Agent, or Firm* — DALY, CROWLEY, MOFFORD & DURKEE, LLP

(57) ABSTRACT

Methods and apparatus for a sensor having an ADC including acquiring data samples at a first resolution in a sensor having an ADC that digitizes the data samples and processing the data samples to obtain a value for parameter and determine a difference between the value and a first threshold. Further data samples are acquired at a second resolution higher than the first resolution if the difference is less than a selected amount.

26 Claims, 5 Drawing Sheets

LOW POWER SENSOR HAVING ADAPTIVE ADC RESOLUTION

BACKGROUND

As is known in the art, magnetic field sensors have a wide variety of applications for some of which it is desirable to reduce power consumption of devices in the system. For example, some angle/position sensors have a requirement to run in low power mode during times in which the system is in standby mode expecting slow moving stimulus or less frequent events that trigger an action. In this mode, the sensor is activated frequently in small windows of time to acquire one set of measurements. In some known devices, the outcome of the sensor when activated is not the full reading of the sensed quantity, e.g., angle, position, etc., rather, it is an ON/OFF switch state that is obtained by comparing the sensed quantity with a defined threshold. A known way of achieving this requirement is to perform the measurement in the same way the active measurements are obtained and then compare the sensed quantity with the threshold.

SUMMARY

Example embodiments of the disclosure provide methods and apparatus for a magnetic field sensor that performs data acquisition at a first, low-resolution rate until sensing a quantity relatively close to a threshold after which the sensor performs data acquisition at a second, high-resolution data acquisition. With this arrangement, the average energy needed per acquisition is reduced without degrading performance.

It will be appreciated that in example sensor devices full resolution of an ADC sample is not necessary for threshold comparison to determine the correct polarity of the output switch unless the sensed quantity is relatively close to the threshold. If the sensed quantity is relatively far from the threshold, a coarse (low resolution) ADC sample can be made that requires less processing time and energy consumption.

In one aspect, a method comprises: acquiring data samples at a first ADC resolution in a sensor having an ADC that digitizes the data samples; processing the data samples to obtain a value for a parameter; determine a difference between the value and a first threshold; and acquiring further data samples at a second ADC resolution higher than the first resolution if the difference is less than a selected amount.

A method can further include one or more of the following features: the parameter is position of a target, the first resolution comprises 8 bits, the second resolution comprises 16 bits, the sensor comprises a position sensor, the sensor comprises a magnetic field sensor, the first threshold corresponds to a selected target position, the target comprises a ferromagnetic target on a brake pedal, the difference corresponds to a distance from a location corresponding to the threshold and a position of the target, the target movement is linear and bidirectional, performing a comparison of the first threshold and the value using the high resolution ADC data sample, modifying an output of the sensor when the high resolution ADC data sample exceeds the first threshold, modifying an output of the sensor when the low resolution ADC data sample exceeds the first threshold, and/or a second threshold, wherein the first threshold is used for target movement in a first direction and the second threshold is used for target movement in the second direction.

In another aspect, a sensor comprises: magnetic field sensing elements to acquire data samples at a first ADC resolution in a sensor having an ADC that digitizes the data samples; a processor configured to: process the data samples to obtain a value for a parameter; determine a difference between the value and a first threshold; and acquire further data samples at a second ADC resolution higher than the first resolution if the difference is less than a selected amount.

A sensor can further include one or more of the following features: the parameter is position of a target, the first resolution comprises 8 bits, the second resolution comprises 16 bits, the sensor comprises a position sensor, the sensor comprises a magnetic field sensor, the first threshold corresponds to a selected target position, the target comprises a ferromagnetic target on a brake pedal, the difference corresponds to a distance from a location corresponding to the threshold and a position of the target, the target movement is linear and bidirectional, performing a comparison of the first threshold and the value using the high resolution ADC data sample, modifying an output of the sensor when the high resolution ADC data sample exceeds the first threshold, modifying an output of the sensor when the low resolution ADC data sample exceeds the first threshold, and/or a second threshold, wherein the first threshold is used for target movement in a first direction and the second threshold is used for target movement in the second direction.

BRIEF DESCRIPTION OF THE DRAWINGS

The foregoing features of this disclosure, as well as the disclosure itself, may be more fully understood from the following description of the drawings in which.

DETAILED DESCRIPTION

Figure 1:
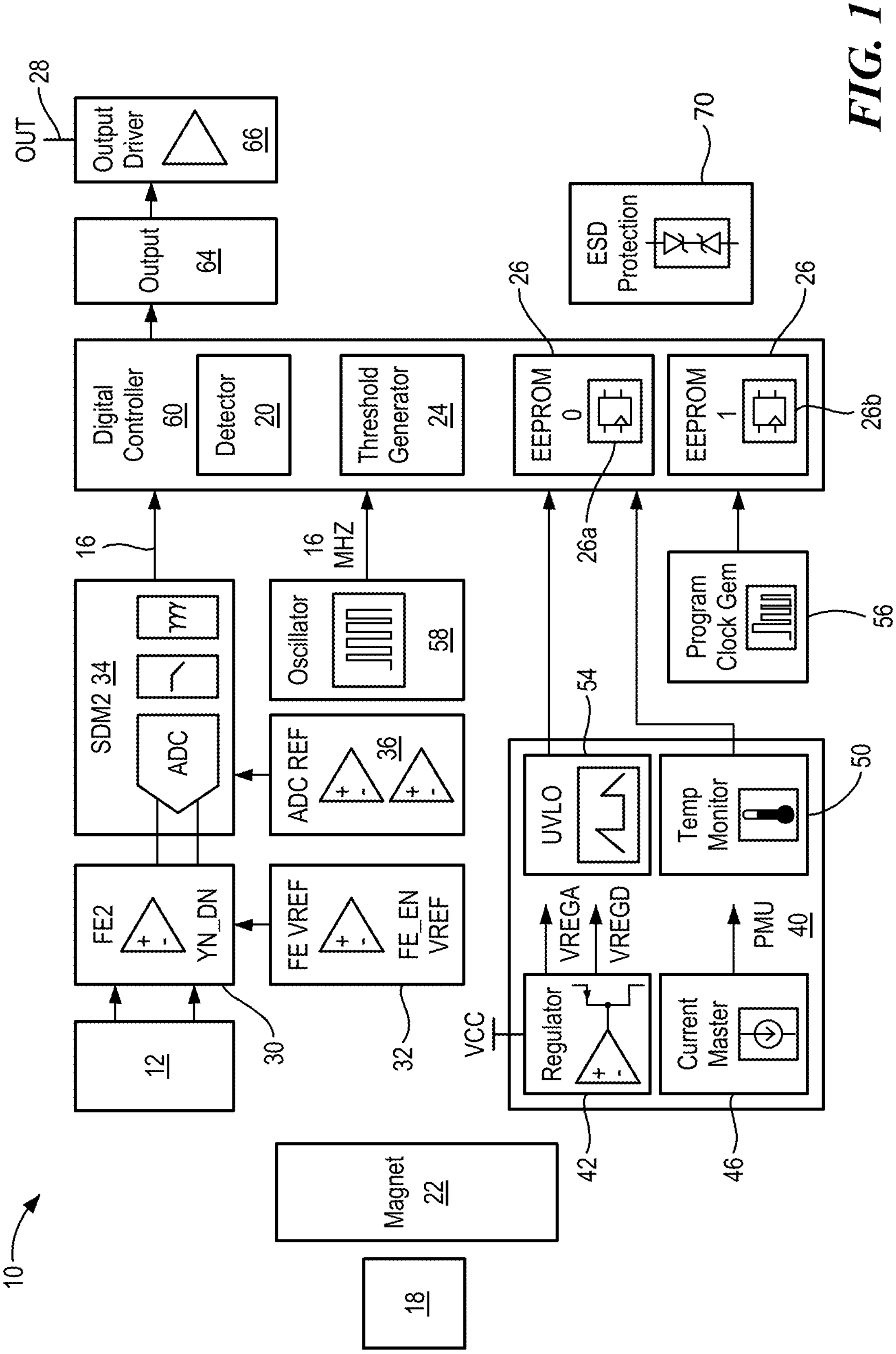
FIG. 1 is a schematic representation of an example sensor configured to perform data acquisition at a first, low-resolution rate until sensing a quantity relatively close to a threshold after which the sensor performs data acquisition at a second high-resolution data acquisition.

FIG. 1 shows an example magnetic field sensor 10 configured to perform data acquisition at a first, low-resolution rate until sensing a quantity relatively close to a threshold after which the sensor performs data acquisition at a second high-resolution data acquisition in accordance with example embodiments of the disclosure. It is understood that a wide variety of sensor types, such as current, position, angle, speed, and other applications can be used in which reduced power consumption is desirable.

The sensor 10 is configured to generate a digital signal 16 indicative of a magnetic field associated with a target 18 and a detector 20 responsive to the magnetic field signal and to a threshold level from a threshold generator 24 to generate a sensor output signal 28 containing target position information in response to the magnetic field signal crossing the threshold level. It is understood that the target 18 can have a variety of forms, including, but not limited to ferromagnetic objects that move linearly. In the example embedment of FIG. 1, magnetic field sensor 10 may detect bidirectional linear movement of a ferromagnetic portion of a brake pedal.

Sensing elements 12 can take a variety of forms, such as Hall elements and MR elements, as may be arranged in one or more bridge or other configurations in order to generate one or more single-ended or differential signals indicative of the sensed magnetic field. A front-end amplifier 30 can be used to process the magnetic field sensing element output signal to generate a further signal for coupling to an analog-to-digital converter (ADC) 34 as may include one or more filters, such as a low pass filter and/or notch filter, and as may take the form of a SAR type ADC to generate a digital magnetic field signal 16. Features of the magnetic field signal processing can include a front-end reference 32 and a reference voltage generator 36.

Sensor 10 includes a power management unit (PMU) 40 as may contain various circuitry to perform power management functions. For example, a regulator 42 can output a regulated voltage for powering analog circuitry of the sensor (VREGA) and/or a regulated voltage for powering digital circuitry of the sensor (VREGD). A bias current source 46, a temperature monitor 50 and an undervoltage lockout 54 can monitor current, temperature, and voltage levels and provide associated status signals to a digital controller 60. A clock generation element 56 and an oscillator 58 are coupled to the digital controller 60.

Digital controller 60 processes the magnetic field signal 16 to determine the speed, position, and/or direction of movement, such as linear movement of target 18 and outputs one or more digital signals to an output protocol module 64. More particularly, controller 60 determines the speed, position, and/or direction of target 18 based on the digital signal 16 and can combine this information with fault information in some embodiments to generate the sensor output signal 28 in various formats. The output of module 64 is fed to an output driver 66 that provides the sensor output signal 28 in various formats, such as a so-called two-wire format in which the output signal is provided in the form of current pulses on the power connection to the sensor or a three-wire format in which the output signal is provided at a separate dedicated output connection. Formats of the output signal 28 can include variety of formats, for example a pulse-width modulated (PWM) signal format, a Single Edge Nibble Transmission (SENT) format, a Serial Peripheral Interface (SPI) format, a Local Interconnect Network (LIN) format, a CAN (Controller Area Network) format, an Inter-Integrated Circuit ($I^2C$) format, or other similar signal formats. Sensor 10 can further include electrostatic discharge (ESD) protection 70.

The digital controller 60 includes detector 20, threshold generator 24, and memory 26 such as EEPROMs 26*a*, 26*b*. In embodiments, memory can include volatile memory. Memory 26 can be used to store values for various sensor functionality including storing function coefficients for use by the threshold generator 24 in generating the threshold levels for use by detector 20.

Detector 20 is coupled to receive the threshold level thus generated and the sensed signal 16 and compare the received levels to generate a binary, two-state, detector output signal that has transitions when the signal 16 crosses the threshold level. Movement and speed of the target 18 can be detected in accordance with the frequency of the binary signal. It should be appreciated that movement of the target 18 may be determined in embodiments containing multiple sensing elements 12.

In embodiments, detection is not based on the output of the ADC directly. The ADC output is processed from which another signal is generated and applied to the detector. This can include processing signal from multiple ADCs and/or multiple channels. For example, an angle can be obtained by taking the ARCTAN of two channels after correction.

It is understood that embodiments of TMR-based sensing elements are useful in a wide variety of magnetic sensors. While an example sensor is shown and described above, any practical magnetic sensor in which TMR sensing elements are desirable can be provided. For example, TMR sensing elements are useful in many magnetic position and angle sensors that require high resolution.

Figure 2A:
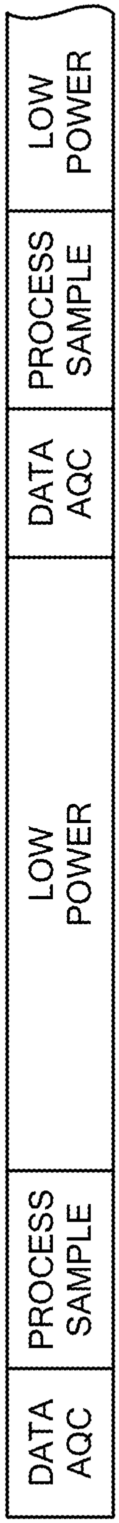
FIG. 2A is a schematic representation of sensor operation including data acquisition of a data sample, processing of the data sample and low power mode.

FIG. 2A shows an example mode operation sequence for a sensor configured to perform data acquisition, which may initially be at a first, low-resolution rate until sensing a quantity relatively close to a threshold after which the sensor performs data acquisition at a second high-resolution data acquisition. A data acquisition mode is entered to sample data by an ADC followed by a process sample mode during which the sampled ADC data is processed, such as by a digital signal processor (DSP). After processing, a low power mode is entered until the next data sample is taken.

Figure 2B:
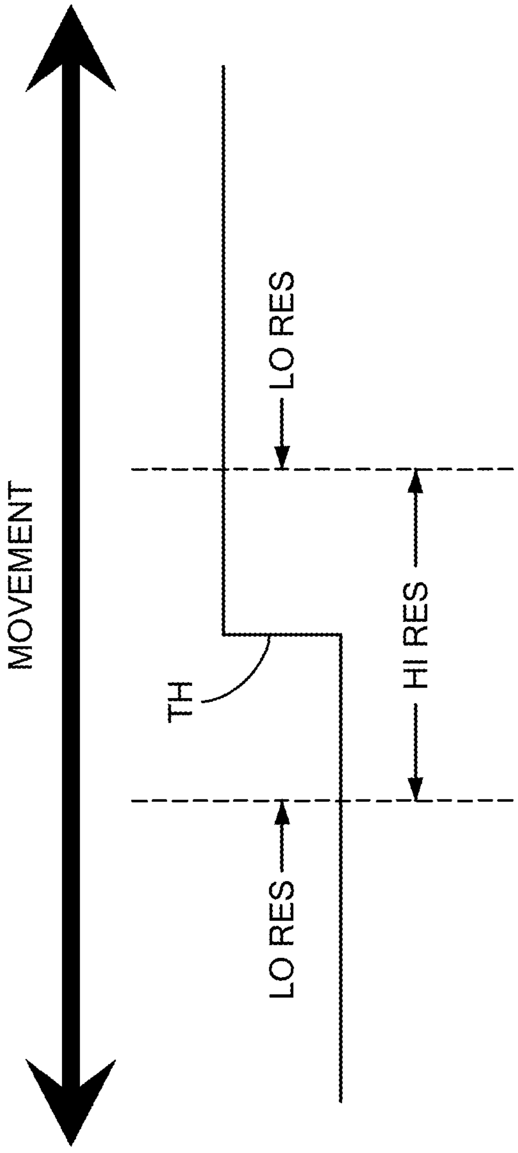
FIG. 2B shows bidirectional movement of a target of interest in relation to a threshold and areas of lo and hi resolution data sampling.

FIG. 2B shows an example implementation of a sensor for detecting the position of a brake pedal having bidirectional linear movement, shown as left and right movement in the illustrated embodiment in order to facilitate an understanding of the disclosure. Initially, the pedal may be on the left side of the page and relatively far from the threshold TH of interest. Since the pedal is far from the threshold, low resolution LO RES data samples, e.g., 8 bits, provide sufficient resolution for comparison to the threshold. As the pedal is depressed causing movement to the right, the distance to the threshold TH becomes smaller. At a certain point, when the distance is less that a selected value, data acquisition enters high resolution mode HI RES in order to provide more precision for comparing the acquired value to the threshold. As the pedal continues to move to the right, after passing the threshold, the distance from the threshold TH increases until low resolution LO RES samples can be taken.

Similarly, as the pedal moves from right to left, initially, low resolution LO RES samples are taken until the distance to the threshold TH decreases so that high resolution HI RES samples are taken. As the pedal moves further to the left, low resolution LO RES samples can be taken by the ADC once the distance increases sufficiently.

Figure 3:
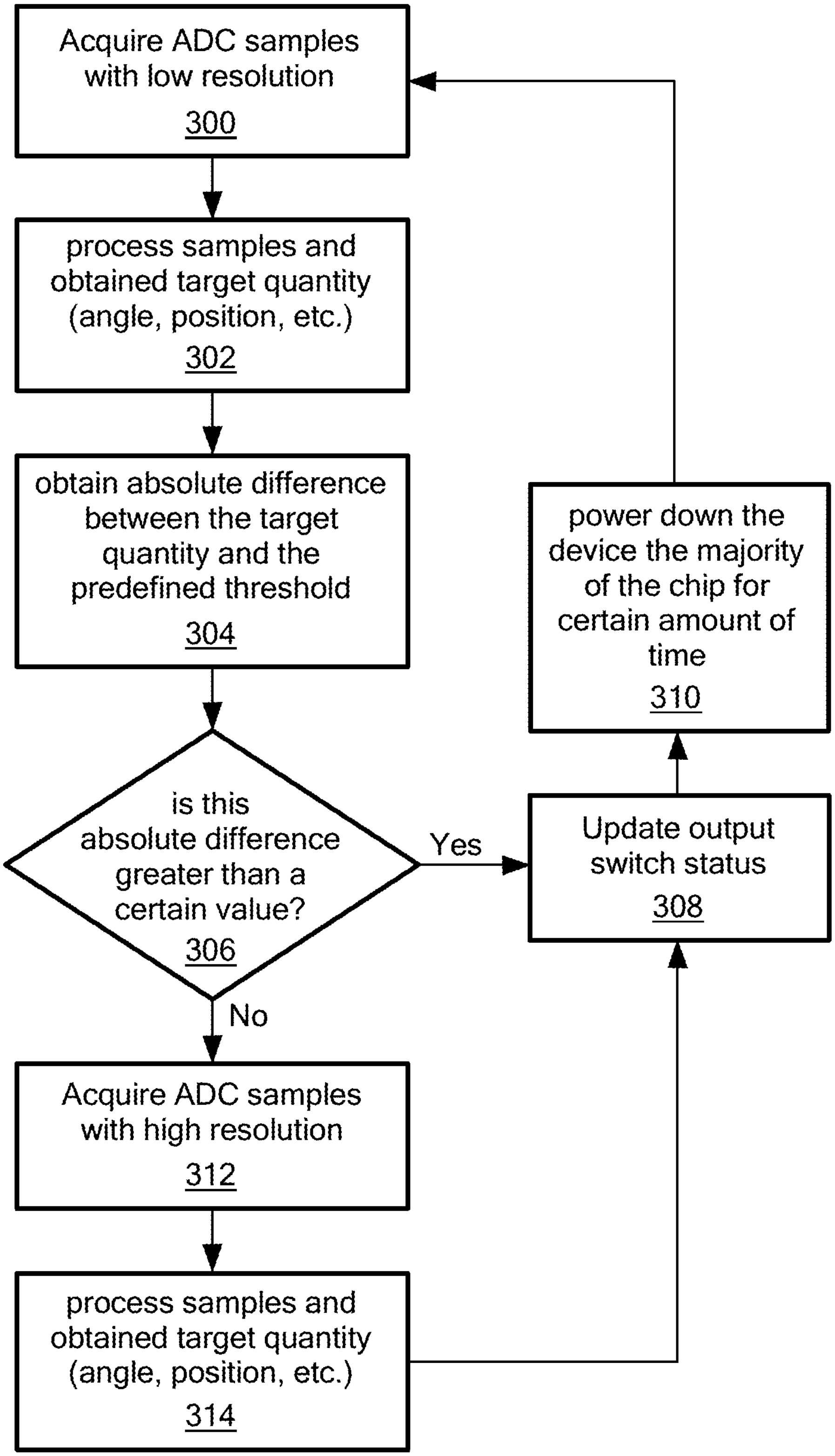
FIG. 3 is a flow diagram showing an example sequence of steps for performing data acquisition at a first, low-resolution rate until sensing a quantity relatively close to a threshold after which the sensor performs data acquisition at a second high-resolution data acquisition.

FIG. 3 shows an example flow diagram for an example sequence of steps for providing data acquisition at a first, low-resolution rate until sensing a value relatively close to a threshold after which the sensor performs data acquisition at a second high-resolution data acquisition. In step 300, a sensor acquires ADC samples at a first resolution that is relatively low. In step 302, the ADC sample is processed to obtain a quantity/value for the measurement of interest, such as target angle, position, speed, and the like. In step 304, the measured value is compared to a first threshold to generate a difference value that represents how close or far the value is to the threshold. That is, a small difference indicates that the measured value is approaching or in the neighborhood of the threshold. In embodiments, the absolute value is used for the comparison which may be useful in applications having bidirectional linear movement. In some embodiments, different thresholds are used for movement in different directions.

In step 306, it is determined whether the difference value is greater than a given value. It is understood that in this example, a large difference indicates that the target is far from the threshold and low resolution data has sufficient accuracy. In example sensor embodiments, an output switch changes status when a threshold is exceeded (or falls below). As noted above, in embodiments, when the threshold is exceeded, the sensor may activate a switch output indicating that the threshold has been exceeded. If the difference was greater than the certain value, in step 308, sensor updates the status of the output switch and in step 310, the sensor powers down for a selected amount of time or until some event occurs. In embodiments, a majority of the device enters a low power mode to minimize power consumption. It will be appreciated that low power resolution for ADC samples reduces the average power for sample acquisition.

If, as determined in step 306, the difference value is less than the certain value, e.g., the target is relatively close to the threshold, in step 312, the ADC acquires samples in high resolution. In step 314, the sensor processes the high resolution sample and generates a value for the measured parameter, such as position. With this arrangement, a high resolution sample is compared the threshold providing more precision than low resolution samples. Processing then continues in step 308 to update the output switch status and power down in step 310.

In example embodiments, a low resolution ADC sample is 8 bits and a high resolution sample is 16 bits. It is understood that any practical values for high and low ADC resolution samples can be used to meet the needs of a particular application.

Figure 4:
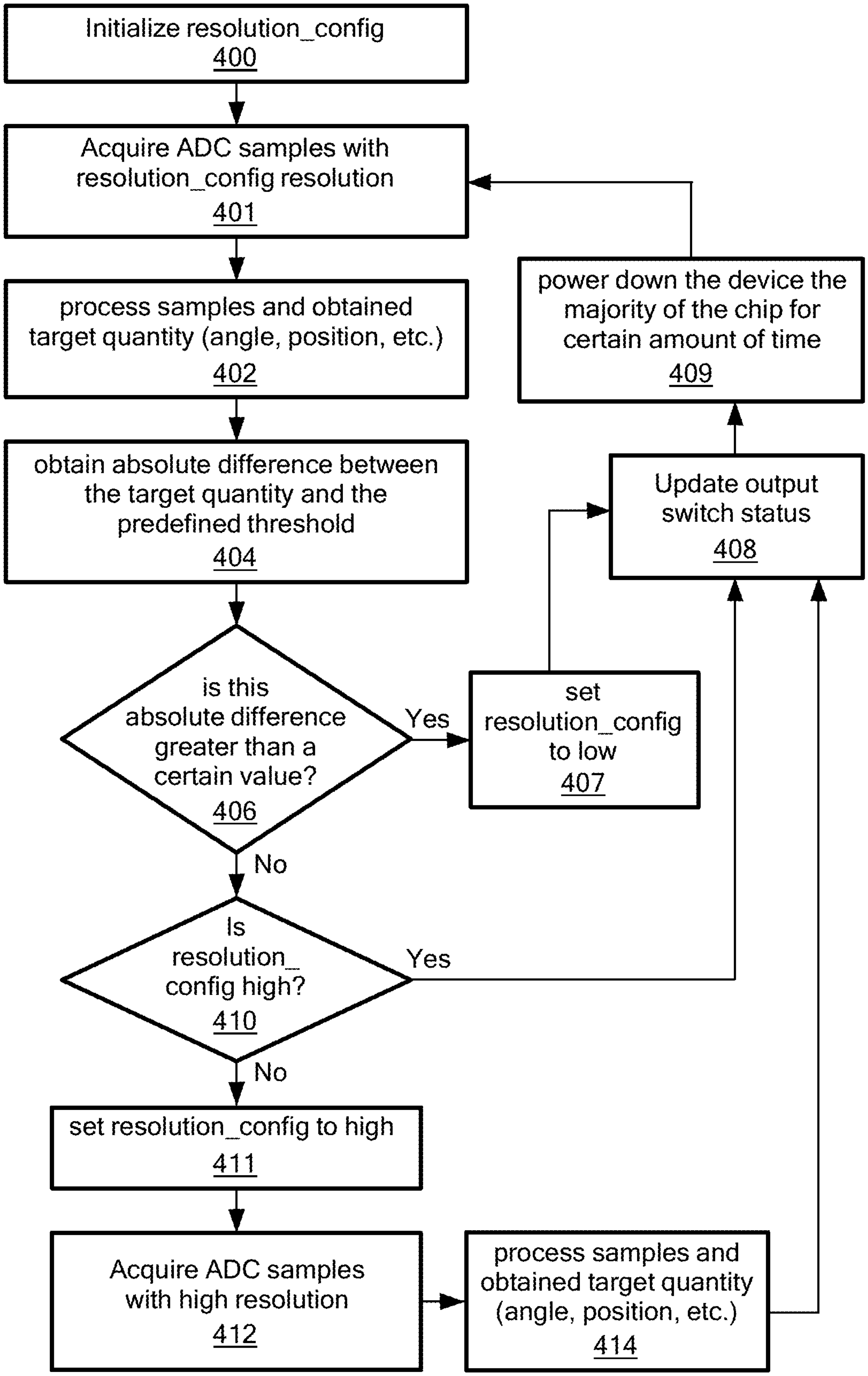
FIG. 4 is a flow diagram showing an example sequence of steps for performing data acquisition in multiple resolutions using a predictive approach.

FIG. 4 shows an example flow diagram for an example sequence of steps for providing data acquisition at different resolutions in a predictive approach. In step 400, a resolution coding field is initialized and in step 401, a sensor acquires ADC samples at the resolution contained in the resolution field, which may be set low or high. In step 402, the ADC sample is processed to obtain a quantity/value for the measurement of interest, such as target angle, position, speed, and the like. In step 404, the measured value is compared to a first threshold to generate a difference value that represents how close or far the value is to the threshold.

In step 406, it is determined whether the difference value is greater than a selected value. If so, in step 407, the resolution configuration field is set to "low." In step 408, sensor updates the status of the output switch and in step 409, the sensor powers down for a selected amount of time.

If, as determined in step 406, the difference value is less than the selected value, in step 410 it is determined whether the resolution configuration field is set high. If so, processing continues in step 408. If not, in step 411 the resolution configuration field is set to "high." In step 412, the ADC acquires samples in high resolution. In step 414, the sensor processes the sample and generates a value for the measured parameter. Processing then continues in step 408 to update the output switch status and power down in step 409. In embodiments, the processing of the high resolution sample determines whether the threshold is exceeded.

As described above, a sensor may require a power-down mode that is activated for short windows of time to acquire a single sample of a target quantity, such as an target position, magnetic field strength, etc., and then enter a sleep mode for a longer period before being awakened after some period or time or event occurrence to acquire another sample. This process repeats continuously.

In low-power mode, minimizing the energy consumed by the device during wake-up time is desirable to meet certain low-power requirements for the device. In embodiments, the energy consumed per sample includes the energy consumed by the analog front end, which includes the ADC, and the energy consumed by the digital processing of the sample. While the energy consumed by the digital processing is relatively fixed, the energy consumed by the analog front end and the ADC often depends on the target resolution. For certain types of ADCs, such as successive approximation register (SAR), incremental, and algorithmic ADCs, the energy consumption is roughly proportional to the acquisition time. Therefore, acquiring a sample with 16-bit resolution can take almost double the time needed for an 8-bit resolution sample.

In example embodiments, a sensor leverages the fact that high-resolution samples are not always necessary to detect or determine whether the sensed quantity is greater or less than a specific threshold. Assuming a uniform distribution of the sensed quantity over the operating range, it is more often far from the threshold, either too high or too low. In these regions, determining the state of the measurement of interest, e.g., much greater or much less than the threshold, can be achieved using low-resolution samples, which is preferred over using unnecessary high resolution samples. With this configuration, the sensor can utilize low-resolution samples to determine the output switch state most of the time, reserving high-resolution samples for when the sensed quantity is near the threshold. In embodiments, the sensor defaults to acquisition in a low-resolution, low-power mode to conserve energy. Only when the sensed quantity approaches the defined thresholds is a sample taken at high resolution.

As used herein, the term "magnetic field sensing element" is used to describe a variety of types of electronic elements that can sense a magnetic field. The magnetic field sensing elements can be, but are not limited to, Hall Effect elements, magnetoresistance elements, inductive sensor or magnetotransistors. As is known, there are different types of Hall Effect elements, for example, planar Hall elements, vertical Hall elements, and circular vertical Hall (CVH) elements. As is also known, there are different types of magnetoresistance elements, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

As is known, some of the above-described magnetic field sensing elements tends to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, most, but not all, types of magnetoresistance elements tend to have axes of maximum sensitivity parallel to the substrate and most, but not all, types of Hall elements tend to have axes of sensitivity perpendicular to a substrate.

As used herein, the term "magnetic field sensor" is used to describe a circuit that includes a magnetic field sensing element. Magnetic field sensors are used in a variety of applications, including, but not limited to, a current sensor that senses a magnetic field generated by a current carried by a current-carrying conductor, a magnetic switch (also referred to herein as a proximity detector) that senses the proximity of a ferromagnetic or magnetic object, a rotation detector that senses passing ferromagnetic articles, for example, gear teeth, and a magnetic field sensor (e.g., a linear magnetic field sensor) that senses a magnetic field density of a magnetic field. Linear magnetic field sensors are used as examples herein. However, the circuits and techniques described herein apply also to any magnetic field sensor capable of detecting a magnetic field. As used herein, the term "magnetic field signal" is used to describe any circuit signal that results from a magnetic field experienced by a magnetic field sensing element.

Figure 5:
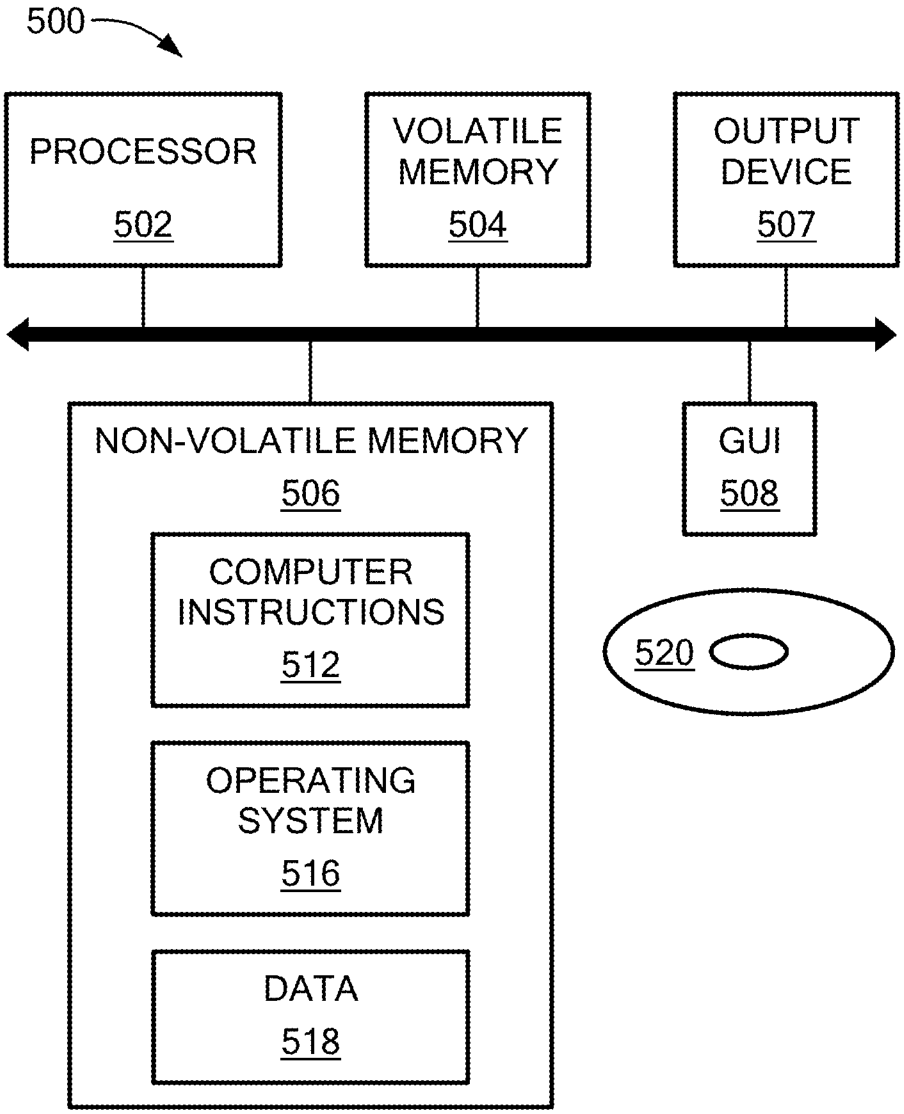
FIG. 5 is a schematic representation of an example computer that can perform at least a portion of the processing described herein.

FIG. 5 shows an exemplary computer 500 that can perform at least part of the processing described herein. For example, the computer 500 can perform processing for chopping channel signals for interpolation and demodulation, as described above. It is understood that processing can be performed in any practical order unless an order is explicitly stated or required to perform the processing. The computer 500 includes a processor 502, a volatile memory 504, a non-volatile memory 506 (e.g., hard disk), an output device 507 and a graphical user interface (GUI) 508 (e.g., a mouse, a keyboard, a display, for example). The non-volatile memory 506 stores computer instructions 512, an operating system 516 and data 518. In one example, the computer instructions 512 are executed by the processor 502 out of volatile memory 504. In one embodiment, an article 520 comprises non-transitory computer-readable instructions.

Processing may be implemented in hardware, software, or a combination of the two. Processing may be implemented in computer programs executed on programmable computers/machines that each includes a processor, a storage medium or other article of manufacture that is readable by the processor (including volatile and non-volatile memory and/or storage elements), at least one input device, and one or more output devices. Program code may be applied to data entered using an input device to perform processing and to generate output information.

The system can perform processing, at least in part, via a computer program product, (e.g., in a machine-readable storage device), for execution by, or to control the operation of, data processing apparatus (e.g., a programmable processor, a computer, or multiple computers). Each such program may be implemented in a high-level procedural or object-oriented programming language to communicate with a computer system. However, the programs may be implemented in assembly or machine language. The language may be a compiled or an interpreted language and it may be deployed in any form, including as a stand-alone program or as a module, component, subroutine, or other unit suitable for use in a computing environment. A computer program may be deployed to be executed on one computer or on multiple computers at one site or distributed across multiple sites and interconnected by a communication network. A computer program may be stored on a storage medium or device (e.g., CD-ROM, hard disk, or magnetic diskette) that is readable by a general or special purpose programmable computer for configuring and operating the computer when the storage medium or device is read by the computer.

Processing may also be implemented as a machine-readable storage medium, configured with a computer program, where upon execution, instructions in the computer program cause the computer to operate.

Processing may be performed by one or more programmable embedded processors executing one or more computer programs to perform the functions of the system. All or part of the system may be implemented as special purpose logic circuitry (e.g., an FPGA (field programmable gate array) and/or an ASIC (application-specific integrated circuit)).

Having described exemplary embodiments of the disclosure, it will now become apparent to one of ordinary skill in the art that other embodiments incorporating their concepts may also be used. The embodiments contained herein should not be limited to disclosed embodiments but rather should be limited only by the spirit and scope of the appended claims. All publications and references cited herein are expressly incorporated herein by reference in their entirety.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:

acquiring data samples at a first ADC resolution in a sensor having an ADC that digitizes the data samples;

processing the data samples to obtain a value for a parameter;

determining a difference between the value and a first threshold;

acquiring further data samples at a second ADC resolution higher than the first resolution if the difference is less than a selected amount; and performing a comparison of the first threshold and the value using the high resolution ADC data sample.

2. The method according to claim 1, wherein the parameter is position of a target.

3. The method according to claim 1, wherein first resolution comprises 8 bits.

4. The method according to claim 1, wherein the second resolution comprises 16 bits.

5. The method according to claim 1, wherein the sensor comprises a position sensor.

6. The method according to claim 1, wherein the sensor comprises a magnetic field sensor.

7. The method according to claim 1, wherein the first threshold corresponds to a selected target position.

8. The method according to claim 7, wherein the target comprises a ferromagnetic target on a brake pedal.

9. The method according to claim 1, wherein the difference corresponds to a distance from a location corresponding to the threshold and a position of the target.

10. The method according to claim 9, wherein the target movement is linear and bidirectional.

11. The method according to claim 1, further including modifying an output of the sensor when the high resolution ADC data sample exceeds the first threshold.

12. The method according to claim 1, further including modifying an output of the sensor when the low resolution ADC data sample exceeds the first threshold.

13. A method, comprising:

acquiring data samples at a first ADC resolution in a sensor having an ADC that digitizes the data samples;

processing the data samples to obtain a value for a parameter;

determining a difference between the value and a first threshold;

acquiring further data samples at a second ADC resolution higher than the first resolution if the difference is less than a selected amount, wherein the first threshold is used for target movement in a first direction and a second threshold is used for target movement in the second direction.

14. A sensor, comprising:
magnetic field sensing elements to acquire data samples at a first ADC resolution in the sensor having an ADC that digitizes the data samples;
a processor configured to:
process the data samples to obtain a value for a parameter;
determine a difference between the value and a first threshold;
acquire further data samples at a second ADC resolution higher than the first resolution if the difference is less than a selected amount; and
perform a comparison of the first threshold and the value using the high resolution ADC data sample.

15. The sensor according to claim 14, wherein the parameter is position of a target.

16. The sensor according to claim 14, wherein first resolution comprises 8 bits.

17. The sensor according to claim 14, wherein the second resolution comprises 16 bits.

18. The sensor according to claim 14, wherein the sensor comprises a position sensor.

19. The sensor according to claim 14, wherein the sensor comprises a magnetic field sensor.

20. The sensor according to claim 14, wherein the first threshold corresponds to a selected target position.

21. The sensor according to claim 20, wherein the target comprises a ferromagnetic target on a brake pedal.

22. The sensor according to claim 14, wherein the difference corresponds to a distance from a location corresponding to the threshold and a position of the target.

23. The sensor according to claim 22, wherein the target movement is linear and bidirectional.

24. The sensor according to claim 14, wherein the processor is further configured to modify an output of the sensor when the high resolution ADC data sample exceeds the first threshold.

25. The sensor according to claim 24, wherein the processor is further configured to modify an output of the sensor when the low resolution ADC data sample exceeds the first threshold.

26. A sensor, comprising:
magnetic field sensing elements to acquire data samples at a first ADC resolution in the sensor having an ADC that digitizes the data samples; and
a processor configured to:
process the data samples to obtain a value for a parameter;
determine a difference between the value and a first threshold; and
acquire further data samples at a second ADC resolution higher than the first resolution if the difference is less than a selected amount, wherein the first threshold is used for target movement in a first direction and a second threshold is used for target movement in the second direction.

* * * * *